United States Patent
Onimoto

(10) Patent No.: US 9,831,590 B2
(45) Date of Patent: Nov. 28, 2017

(54) MOLDED CONNECTOR, METHOD FOR MANUFACTURING MOLDED CONNECTOR, AND WIRE HARNESS

(71) Applicant: Hitachi Metals, Ltd., Tokyo (JP)

(72) Inventor: Takashi Onimoto, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/102,473

(22) PCT Filed: Sep. 30, 2014

(86) PCT No.: PCT/JP2014/076018
§ 371 (c)(1),
(2) Date: Jun. 7, 2016

(87) PCT Pub. No.: WO2016/051489
PCT Pub. Date: Apr. 7, 2016

(65) Prior Publication Data
US 2016/0322731 A1 Nov. 3, 2016

(51) Int. Cl.
*H01R 13/405* (2006.01)
*B29C 70/72* (2006.01)
(Continued)

(52) U.S. Cl.
CPC ...... *H01R 13/405* (2013.01); *B29C 45/14639* (2013.01); *B29C 70/72* (2013.01);
(Continued)

(58) Field of Classification Search
CPC ... B29C 45/14639; B29C 70/72; H01L 21/56; H01R 13/405
(Continued)

(56) References Cited

U.S. PATENT DOCUMENTS 6,527,989 B1 * 3/2003 Onoda ............ B29C 45/14065
174/60
8,480,421 B2 * 7/2013 Yoshioka ............ H01R 13/504
439/275

FOREIGN PATENT DOCUMENTS

JP 10-189134 A 7/1998
JP 11-54192 A 2/1999
(Continued)

OTHER PUBLICATIONS

International Search Report issued in a corresponding application PCT/JP2014/076018 dated Dec. 9, 2014.
(Continued)

*Primary Examiner* — Abdullah Riyami
*Assistant Examiner* — Justin Kratt
(74) *Attorney, Agent, or Firm* — Roberts Mlotkowski Safran Cole & Calderon P.C.

(57) ABSTRACT

A molded connector (10) includes a terminal fitting (2) connected to a cable (11), a terminal holding member (3) including a resin and holding the terminal fitting (2), and a molded resin portion (4) formed by injection molding using a mold (5) and holding the terminal holding member (3) and an end portion of the cable (11). The terminal holding member (3) includes a main body (30) holding the terminal fitting (2) and protruding portion (31) that is formed protruding from the main body (30) and includes a tip end surface (31a) in contact with an inner surface of a cavity (5a) in the mold (5) during injection molding. The protruding portion (31) is locked to a locking portion (521) provided on the mold (5 to restrict the movement of the terminal holding member (3) during injection molding. At least a part of the protruding portion (31) is fusion-bonded to the molded resin portion (4).

20 Claims, 8 Drawing Sheets

(51) Int. Cl.
   *B29C 45/14* (2006.01)
   *H01L 21/56* (2006.01)
   *H01R 43/24* (2006.01)
   *H01R 4/18* (2006.01)

(52) U.S. Cl.
   CPC ............. *H01L 21/56* (2013.01); *H01R 4/185* (2013.01); *H01R 43/24* (2013.01)

(58) Field of Classification Search
   USPC ...................................... 439/736; 264/272.11
   See application file for complete search history.

(56) References Cited

FOREIGN PATENT DOCUMENTS

| | | |
|---|---|---|
| JP | 3654564 B2 | 6/2005 |
| JP | 2010-161041 A | 7/2010 |
| JP | 2014-222628 A | 11/2014 |
| JP | 2014222628 A * | 11/2014 |

OTHER PUBLICATIONS

IPRP in related International Application No. PCT/JP2014/076018 dated Apr. 13, 2017.

\* cited by examiner

MOLDED CONNECTOR, METHOD FOR MANUFACTURING MOLDED CONNECTOR, AND WIRE HARNESS

CROSS-REFERENCE TO RELATED APPLICATIONS

The present application is a U.S. National Phase of PCT/JP2014/076018 filed on Sep. 30, 2014. The disclosure of the PCT Application is hereby incorporated by reference into the present Application.

TECHNICAL FIELD

The present invention relates to a molded connector, a method for manufacturing a molded connector and a wire harness.

BACKGROUND ART

Molded connectors are conventionally known and are manufactured by placing an end portion of a cable and a terminal fitting(s) in a cavity of a mold and then injecting and solidifying a molten resin in the cavity (see, e.g., PTL 1).

The method for manufacturing a molded connector described in PTL 1 aims to prevent movement of the terminal fitting in the cavity which is caused by injection pressure of the molten resin during injection molding. Accordingly, to solve this problem, a pin, which is provided on the mold so as to protrude retractable back-and-forth in the cavity, is fitted into a positioning hole provided on the terminal fitting and, once the molten resin is injected into the cavity, the pin is retracted from the cavity before solidification of the injected resin. As such, the terminal fitting is positioned by the pin when injecting the molten resin, and movement of the terminal fitting due to injection pressure of the molten resin can be thereby prevented.

PATENT LITERATURE

PTL 1

JP-A-2010-161041

SUMMARY OF INVENTION

Technical Problem

In the manufacturing method described in PTL 1, however, since the pin is retracted before solidification of the injected resin, there is a risk that the terminal fitting moves with the retracting movement of the pin. Meanwhile, molded connectors of this type are sometimes required to be highly waterproof to prevent corrosion, etc., of the terminal fitting caused by ingress of water. However, in the manufacturing method described in PTL 1, if the molten resin does not sufficiently flow into a space formed in the cavity by retracting of the pin, this space may become the water ingress route.

Therefore, it is an object of the invention to provide a molded connector, a method for manufacturing a molded connector and a wire harness, in or by which terminal fittings are prevented from moving in a cavity during injection molding and waterproof properties are enhanced.

Solution to Problem

To solve the above-mentioned problems, the invention provides a molded connector comprising: terminal fittings connected to a cable; a terminal holding member comprising a resin and holding the terminal fittings; and a molded resin portion formed by injection molding using a mold and holding an end portion of the cable and the terminal holding member, wherein the terminal holding member comprises a main body holding the terminal fittings and a protruding portion that is formed to protrude from the main body and comprises a tip end surface to be in contact with an inner surface of a cavity of the mold during the injection molding, the protruding portion is locked to a locking portion provided on the mold to restrict the terminal holding member from moving during the injection molding, and at least a portion of the protruding portion is fusion-bonded to the molded resin portion.

To solve the above-mentioned problems, the invention also provides a method for manufacturing a molded connector that comprises terminal fittings connected to a cable, a terminal holding member comprising a resin and holding the terminal fittings, and a molded resin portion formed by injection molding using a mold and holding an end portion of the cable and the terminal holding member, wherein the terminal holding member comprises a main body holding the terminal fitting and a protruding portion protruding from the main body, the mold comprises a cavity having an inner surface to be in contact with a tip end surface of the protruding portion and a locking portion for locking the protruding portion, the protruding portion of the terminal holding member is locked to the locking portion to restrict the terminal holding member from moving during the injection molding, and at least a portion of the protruding portion is melted by heat of a molten resin injected into the cavity.

To solve the above-mentioned problems, the invention further provides a wire harness comprising: a cable; terminal fittings connected to the cable; a terminal holding member comprising a resin and holding the terminal fittings; and a molded resin portion formed by injection molding using a mold and holding an end portion of the cable and the terminal holding member, wherein the terminal holding member comprises a main body holding the terminal fittings and a protruding portion that is formed to protrude from the main body and comprises a tip end surface to be in contact with an inner surface of a cavity of the mold during the injection molding, the protruding portion is locked to a locking portion provided on the mold to restrict the terminal holding member from moving during the injection molding, and at least a portion of the protruding portion is fusion-bonded to the molded resin portion.

Advantageous Effects of Invention

According to the invention, it is possible to prevent terminal fittings from moving in a cavity during injection molding and also possible to enhance waterproof properties.

DESCRIPTION OF EMBODIMENTS

[First Embodiment]

The first embodiment of the invention will be described below in reference to FIGS. 1A to 6B.

Figure 1A:
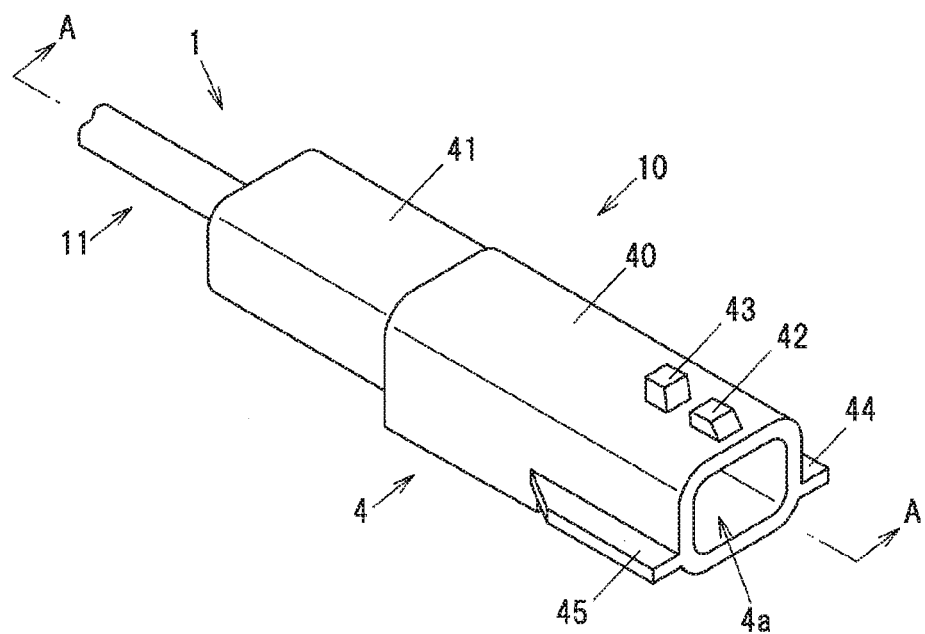
FIG. 1A is a perspective view showing the upper side of a molded connector and a wire harness in a first embodiment of the present invention.
Figure 1B:
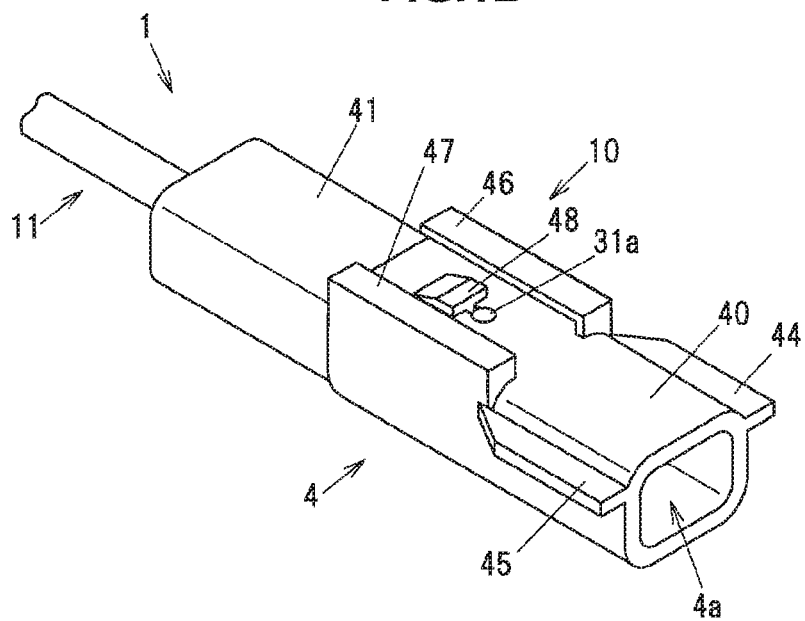
FIG. 1B is a perspective view showing the lower side of the molded connector and the wire harness in the first embodiment of the invention.
Figure 2:
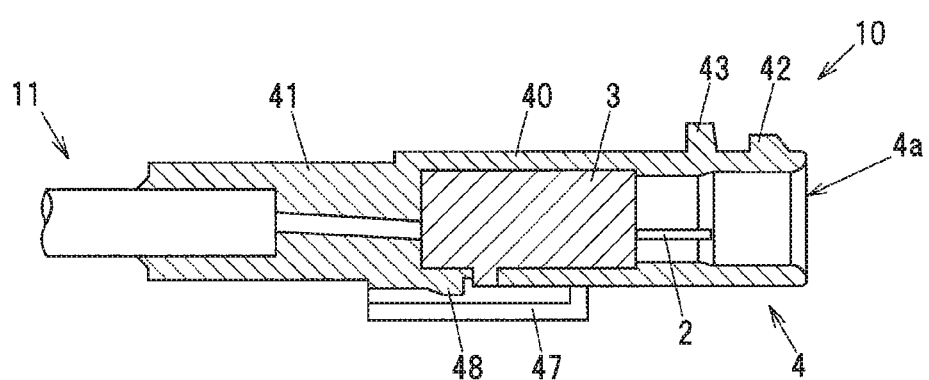
FIG. 2 is a cross sectional view taken along a line A-A in FIG. 1A.

FIGS. 1A and 1B show a molded connector 10 in the first embodiment of the invention and a wire harness 1 provided with the molded connector 10, wherein FIG. 1A is a perspective view showing the upper side of the molded connector 10 and FIG. 1B is a perspective view showing the lower side of the molded connector 10. FIG. 2 is a cross sectional view taken along a line A-A in FIG. 1A.

The wire harness 1 is provided with the molded connector 10 and a cable 11. As shown in FIG. 2, the molded connector 10 is provided with terminal fittings 2 connected to the cable 11, a terminal holding member 3 formed of a resin and holding the terminal fittings 2, and a molded resin portion 4 formed by injection molding using a mold (described later) and holding an end portion of the cable 11 and the terminal holding member 3.

A recessed portion 4a to fit another connector (not shown) is formed on the molded resin portion 4, and end portions of the terminal fittings 2 protrude from the terminal holding member 3 inside the molded resin portion 4. When the other connector is fitted into the molded resin portion 4, the terminal fittings 2 come into contact with terminal fittings of the other connector.

The molded resin portion 4 integrally has a rectangular cylindrical main body 40 holding the terminal holding member 3, a cable holding portion 41 holding an end portion of the cable 11, first to fourth protrusions 42 to 45 for fitting and fixing the other connector, a pair of fitting rails 46 and 47 and a fifth protrusion 48 which are provided to fix the molded connector 10 to a device. The recessed portion 4a is formed at one longitudinal end of the main body 40. The cable 11 extends out of the cable holding portion 41 at an end opposite to the recessed portion 4a.

Figure 3A:
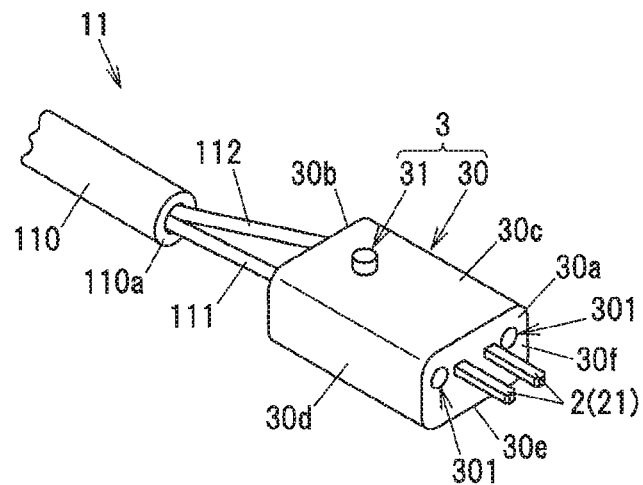
FIG. 3A is a perspective view showing a terminal holding member together with a cable and terminal fittings.
Figure 3B:
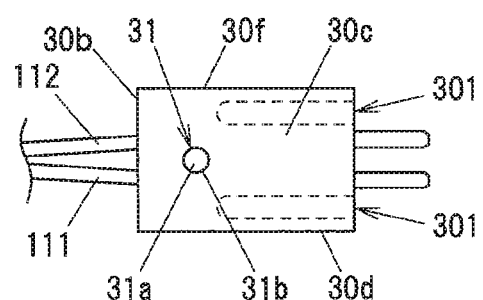
FIG. 3B is a plan view showing the terminal holding member together with the cable and the terminal fittings.
Figure 3C:
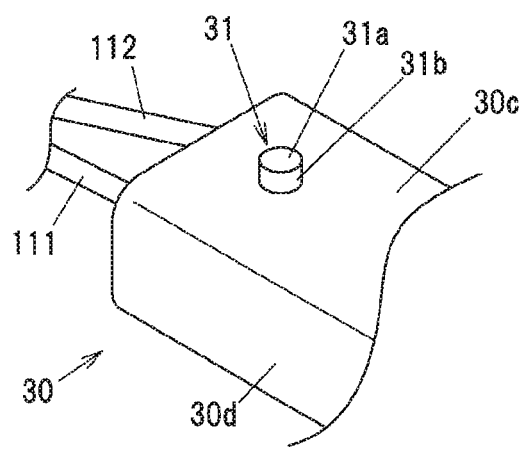
FIG. 3C is a partial enlarged view of FIG. 3A.
Figure 4:
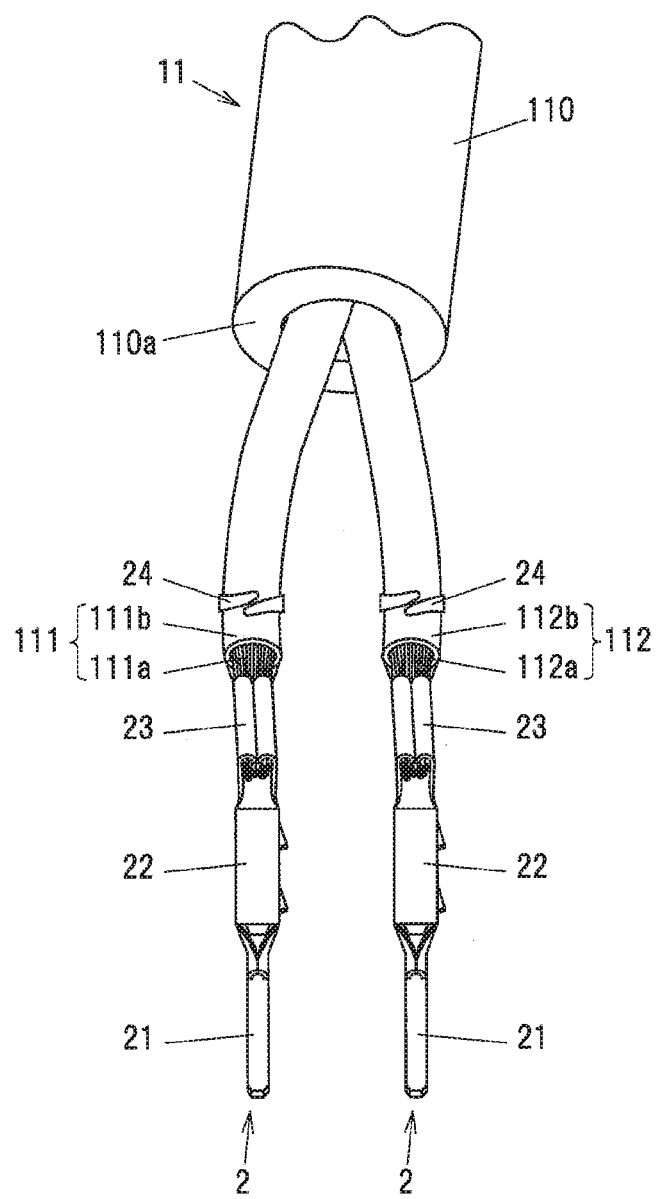
FIG. 4 is an explanatory diagram illustrating the terminal fittings connected to the cable.

FIG. 3A is a perspective view showing the terminal holding member 3 together with the cable 11 and the terminal fittings 2. FIG. 3B is a plan view showing the terminal holding member 2. FIG. 3C is a partial enlarged view of FIG. 3A. FIG. 4 is an explanatory diagram illustrating the terminal fittings 2 connected to the cable 11.

The cable 11 has first and second insulated wires 111 and 112 and a sheath 110 covering all the insulated wires 111 and 112 together, and the terminal fittings 2 are respectively connected to the first and second insulated wires 111 and 112 exposed from an end face 110a of the sheath 110. The first insulated wire 111 has a core wire 111a formed of a highly conductive metal such as copper and an insulation cover 111b formed of an insulating material and covering the core wire 111a. Likewise, the second insulated wire 112 has a core wire 112a formed of a highly conductive metal such as copper and an insulation cover 112b formed of an insulating material and covering the core wire 112a.

The terminal fitting 2 is formed of a conductive metal, and integrally has a contact portion 21 to be in contact with a terminal fitting of another connector, a held portion 22 to be held by the terminal holding member 3, a crimped portion 23 connected to the core wire 111a or 112a by crimping, and a tightening portion 24 for tightening the insulation cover 111b or 112b.

The terminal holding member 3 is formed of, e.g., a resin such as PA (polyamide) or PBT (polybutylene terephthalate), and integrally has a main body 30 holding the terminal fittings 2 and a protruding portion 31 formed to protrude from the main body 30. In the first embodiment, the main body 30 of the terminal holding member 3 is formed in a rectangular parallelepiped shape and has one longitudinal end face 30a from which the contact portions 21 of the terminal fittings 2 protrude. The first and second insulated wires 111 and 112 extend out from another longitudinal end face 30b. First to fourth side surfaces 30c to 30f are formed between the one end face 30a and the other end face 30b of the main body 30.

The protruding portion 31 is formed of a columnar protrusion provided upright on the first side surface 30c which is one of the first to fourth side surfaces 30c to 30f of the main body 30. The first side surface 30c is a surface between the second side surface 30d and the fourth side surface 30f, and the third side surface 30e is a surface opposite to the first side surface 30c.

The protruding portion 31 has a columnar shape in the first embodiment, but it is not limited thereto and it may be, e.g., a rectangular column shape. At a tip portion of the protruding portion 31, a flat circular tip end surface 31a is formed parallel to the first side surface 30c. A side surface (outer peripheral surface) 31b of the protruding portion 31, which is formed around the tip end surface 31a, is perpendicular to the first side surface 30c of the main body 30.

The main body 30 of the terminal holding member 3 also has a pair of fitting holes 301 into which a pair of pins 60 (see FIG. 6A) of a die insert 6 used together with the mold (described later) for molding the molded resin portion 4 are fitted. The fitting holes 301 extend along the longitudinal direction of the main body 30 and have openings on the one end face 30a.

The two terminal fittings 2, which are connected to the first and second insulated wires 111 and 112 as shown in FIG. 4, are pushed into the main body 30 from the other end face 30b side and are held by the terminal holding member 3. The held portions 22 are locked to hooks (not shown) formed on the main body 30 and the terminal fittings 2 are thereby prevented from slipping out of the terminal holding member 3.

The molded resin portion 4 is formed by injection molding which is performed by injecting a molten resin into a cavity of the mold. Next, a method for manufacturing the molded connector 10 including the molded resin portion 4 will be described.

(Method for Manufacturing Molded Connector 10)

Figure 5A:
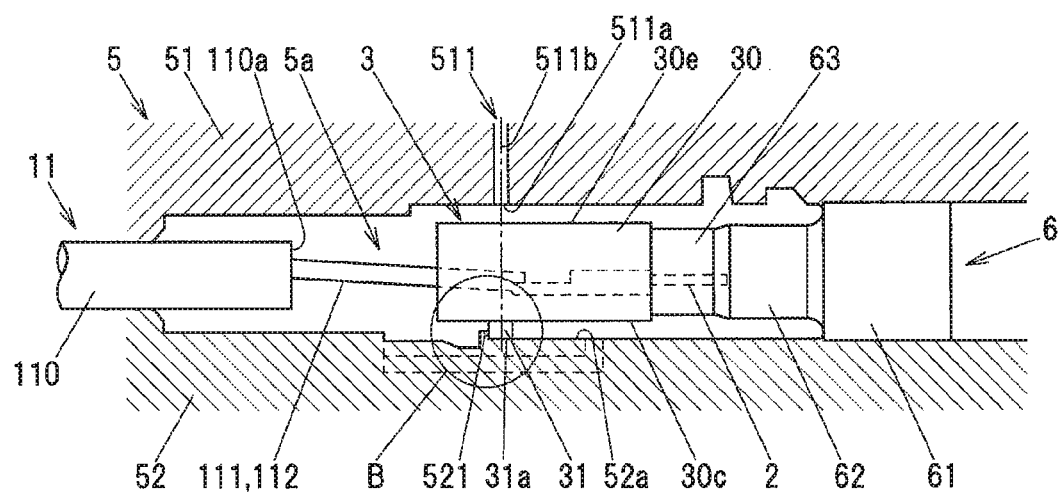
FIG. 5A is an explanatory diagram illustrating a mold and a die insert which are used for manufacturing the molded connector, and also showing the terminal holding member, the terminal fittings and an end portion of the cable which are housed in a cavity of the mold.
Figure 5B:
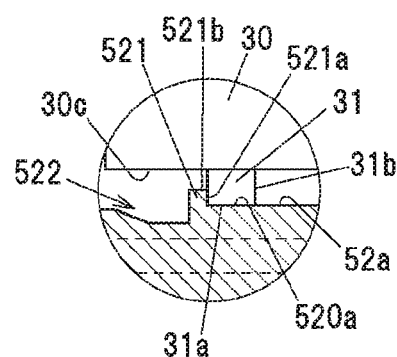
FIG. 5B is an enlarged view of a portion B in FIG. 5A.

FIG. 5A is an explanatory diagram illustrating a mold 5 and the die insert 6 which are used for manufacturing the molded connector 10, and also showing the terminal holding member 3, the terminal fittings 2 and an end portion of the cable 11 which are housed in a cavity 5a of the mold 5. FIG. 5B is an enlarged view of a portion B in FIG. 5A. In FIG. 5A, the terminal fittings 2 and the first and second insulated wires 111 and 112 located inside the terminal holding member 3 are indicated by dashed lines.

The mold 5 has an upper mold 51 and a lower mold 52, and the cavity 5a as a mold space is formed by combining the upper mold 51 with the lower mold 52. Then, the die insert 6 is arranged between the upper mold 51 and the lower mold 52.

An injection hole 511 is formed on the upper mold 51 to inject a molten resin into the cavity 5a at the time of injection molding. The molten resin is obtained by heating and melting, e.g., the same resin as the terminal holding member 3 and is injected into the cavity 5a through an opening 511a of the injection hole 511.

Figure 5C:
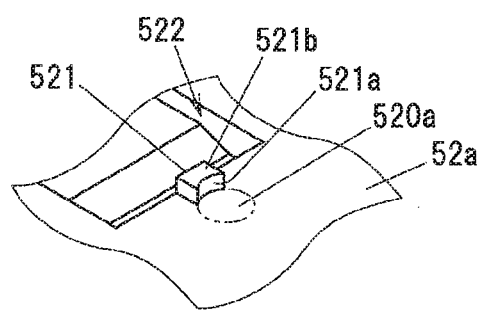
FIG. 5C is a perspective view showing a locking portion of the mold and the periphery thereof.

A locking portion 521 is provided on the lower mold 52 to lock the protruding portion 31 of the terminal holding member 3. FIG. 5C is a perspective view showing the locking portion 521 and the periphery thereof.

The locking portion 521 is formed in a wall shape protruding toward the upper mold 51 from a cavity-forming surface 52a of the lower mold 52 which is a surface facing the first side surface 30c of the main body 30 of the terminal holding member 3 with a gap therebetween. In the first embodiment, the locking portion 521 is formed adjacent to a recessed portion 522 provided to form the fifth protrusion 48 (see FIG. 1B) of the molded resin portion 4, and has a concave curved contact surface 521a to be in contact with the protruding portion 31 of the terminal holding member 3, as shown in FIG. 5C. The shape, however, is not limited thereto and the locking portion 521 may have, e.g., a rectangular parallelepiped shape.

A protruding length (a height of protrusion) of the locking portion 521 from the cavity-forming surface 52a is smaller than a protruding length of the protruding portion 31 from the third side surface 30c of the main body 30 of the terminal holding member 3. Thus, when the terminal holding member 3 is placed in the cavity 5a, a gap allowing a molten resin to flow therethrough is formed between a top face 521b of the locking portion 521 and the third side surface 30c of the main body 30 of the terminal holding member 3.

A flat contact surface 520a to be in contact with the tip end surface 31a of the protruding portion 31 of the terminal holding member 3 is formed on the cavity-forming surface 52a of the lower mold 52 on the contact surface 521a side of the locking portion 521. In FIG. 5C, the outer rim of the contact surface 520a is indicated by a dash-dot-dot line. The locking portion 521 is formed at a position on a side of the contact surface 520a, closer to the sheath 110 of the cable 11. Therefore, a portion of the side surface 31b of the protruding portion 31 in a region on the sheath 110 side comes into contact with the contact surface 521a of the locking portion 521.

The opening 511a of the injection hole 511 of the upper mold 51 faces toward the contact surface 520a of the lower mold 52. That is, if the terminal holding member 3 is not placed in the cavity 5a when the molten resin is injected from the opening 511a of the injection hole 511, the injected molten resin firstly hits the contact surface 520a of the cavity-forming surface 52a of the lower mold 52. In other words, the opening 511a of the injection hole 511 and the contact surface 520a face each other along an extension line 511b of the injection hole 511 (an imaginary line of extension of the center axis of the injection hole 511) with the terminal holding member 3 interposed therebetween.

Figure 6A:
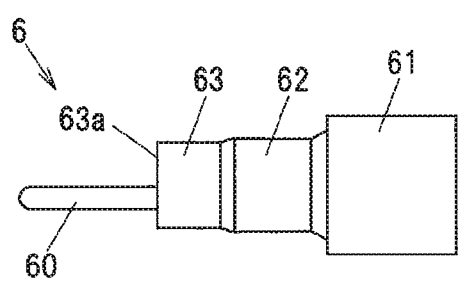
FIG. 6A is a side view showing the die insert.
Figure 6B:
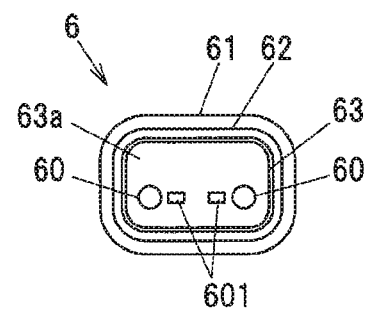
FIG. 6B is a front view showing the die insert on a side facing the terminal holding member.

FIG. 6A is a side view showing the die insert 6. FIG. 6B is a front view showing the die insert 6 on a side facing the terminal holding member 3. The die insert 6 has first to third rectangular column portions 61 to 63, and these first to third rectangular column portions 61 to 63 are aligned along a longitudinal direction of the die insert 6. A cross section of the second rectangular column portion 62 orthogonal to the longitudinal direction has a larger area than a cross section of the third rectangular column portion 63 on the terminal holding member 3 side, and a cross section of the first rectangular column portion 61 has a further larger area than the cross section of the second rectangular column portion 62. The first rectangular column portion 61 is smoothly coupled to the second rectangular column portion 62 and the second rectangular column portion 62 to the third rectangular column portion 63, thereby forming a tapered shape.

The die insert 6 also has the pair of pins 60 which are fitted into the pair of fitting holes 301 of the terminal holding member 3. The pair of pins 60 protrude along the longitudinal direction of the die insert 6 from a facing surface 63a of the third rectangular column portion 63 which is a surface facing the terminal holding member 3. Furthermore, the die insert 6 has a pair of insertion holes 601 into which the contact portions 21 of the two terminal fittings 2 held by the terminal holding member 3 are respectively inserted. The insertion holes 601 are formed parallel to the pins 60 and have openings on the facing surface 63a facing the terminal holding member 3.

The die insert 6 is configured that the first rectangular column portion 61 sandwiched between the upper mold 51 and the lower mold 52 blocks the molten resin injected into the cavity 5a, and the terminal holding member 3 and the terminal fittings 2 are supported during injection molding by the pair of pins 60 fitted into the pair of fitting holes 301 and the contact portions 21 of the terminal fittings 2 inserted into the insertion holes 601 of the die insert 6. The recessed portion 4a (shown in FIGS. 1A and 1B) of the molded resin portion 4 is formed by the second rectangular column portion 62 and the third rectangular column portion 63 of the die insert 6.

To form the molded connector 10, the terminal fittings 2 connected to the cable 11 are placed, together with the terminal holding member 3, inside the cavity 5a of the mold 5 and the molten resin is injected into the cavity 5a from the opening 511a of the injection hole 511 in a state that the die insert 6 is sandwiched between the upper mold 51 and the lower mold 52. The molten resin injected into the cavity 5a is solidified by temperature drop and the molded resin portion 4 is thereby formed.

When the terminal holding member 3 holding the terminal fittings 2 is placed in the cavity 5a, the tip end surface 31a of the protruding portion 31 of the terminal holding member 3 comes into contact with an inner surface of the cavity 5a (the contact surface 520a of the lower mold 52). Meanwhile, the side surface 31b of the protruding portion 31 comes into contact with, or faces with a slight gap, the contact surface 521a of the locking portion 521. In this arrangement, the tip end surface 31a of the protruding portion 31 intersects with the extension line 511b of the injection hole 511.

When the molten resin is injected from the injection hole 511, the injected molten resin firstly hits the third side surface 30e of the main body 30 of the terminal holding member 3. A force toward the lower mold 52 is applied to the terminal holding member 3 by pressure of the molten resin, but movement of the terminal holding member 3 toward the lower mold 52 is restricted by contact between the tip end surface 31a of the protruding portion 31 and the contact surface 520a of the lower mold 52, and a gap allowing the molten resin to flow therein is formed between the third side surface 30c of the terminal holding member 3 and the cavity-forming surface 52a of the lower mold 52.

The molten resin flows through the gap between the third side surface 30e of the terminal holding member 3 and the upper mold 51 and then fills each portion in the cavity 5a. The molten resin reached a portion to be the cable holding portion 41 of the molded resin portion 4 then flows along the first and second insulated wires 111 and 112 extending out of the main body 30 of the terminal holding member 3 and flows into a space around the sheath 110. At this time, pressure acts on the end face 110a of the sheath 110 due to the flow of the molten resin, and a force in a direction of coming out of the cavity 5a is applied to the cable 11 by this pressure.

In this case, if the terminal holding member 3 is supported only by the die insert 6, the terminal holding member 3 moves, together with the cable 11, toward the side opposite to the die insert 6 (toward the sheath 110). However, in the first embodiment, the protruding portion 31 of the terminal holding member 3 is locked to the locking portion 521 provided on the mold 5 and this restricts the terminal holding member 3 from moving during injection molding. In other words, the contact of the side surface 31b of the terminal holding member 3 with the contact surface 521a of the locking portion 521 restricts the terminal holding member 3 from moving toward sheath 110.

Meanwhile, the temperature of the molten resin is as high as, e.g., not less than 200° C. Therefore, once the cavity 5a is filled with the molten resin, at least a portion of the protruding portion 31 of the terminal holding member 3 is melted by heat thereof. Thus, after solidification of the molten resin, the terminal holding member 3 is fusion-bonded to the molded resin portion 4. In more detail, a portion of the side surface 31b of the protruding portion 31 of the terminal holding member 3, which is not in contact with the contact surface 521a of the locking portion 521, is fusion-bonded to the molded resin portion 4 over the circumference surrounding the tip end surface 31a. This prevents ingress of water into the molded connector 10 through the peripheral portion of the protruding portion 31.

The protruding portion 31 of the terminal holding member 3 has a smaller surface area-to-volume ratio than the main body 30 and thus is more likely to melt by heat of the molten resin than the main body 30. Therefore, the protruding portion 31 can be melted by heat of the molten resin even at a temperature at which the main body 30 does not melt.

In addition, since the tip end surface 31a of the protruding portion 31 is kept in contact with the contact surface 520a of the lower mold 52 during injection molding, the molten resin does not get in between the tip end surface 31a of the protruding portion 31 and the contact surface 520a of the lower mold 52. Therefore, the tip end surface 31a of the protruding portion 31 is exposed on the outer surface of the main body 40 of the molded resin portion 4, as shown in FIG. 1B.

The highly waterproof molded connector 10 is obtained by the manufacturing method described above. The molded connector 10 and the wire harness 1 as described above can be suitably used as a connector for, e.g., an ABS (anti-lock braking system) wheel speed sensor or an electromagnetic brake system for slowing down or stopping wheels in a vehicle.

(Functions and Effects of the First Embodiment)

The following functions and effects are obtained by the embodiment described above.

(1) The terminal holding member 3 holding the terminal fittings 2 is restricted from moving during injection molding by the protruding portion 31 locked to the locking portion 521 of the lower mold 52, and also, the protruding portion 31 is melted by heat of the molten resin and is fusion-bonded to the molded resin portion 4. Therefore, it is possible to prevent the terminal fittings 2 from moving inside the cavity during injection molding and also possible to enhance waterproof properties of the molded connector 10.

(2) The locking portion 521 of the lower mold 52 is formed at a position on a side of the protruding portion 31 of the terminal holding member 3, closer to the sheath 110 of the cable 11. Therefore, even when a moving force toward the sheath 110 due to the pressure of the molten resin acting on the end face 110a of the sheath 110 is applied to the terminal holding member 3 via the first and second insulated wires 111 and 112, the protruding portion 31 is locked to the locking portion 521 and prevents the terminal holding member 3 from moving inside the cavity 5a.

(3) The opening 511a of the injection hole 511 faces toward the contact surface 520a of the lower mold 52 which is a surface facing the protruding portion 31, and the tip end surface 31a of the protruding portion 31 of the terminal holding member 3 intersects with the extension line 511b of the injection hole 511. Therefore, the pressure applied to the main body 30 of the terminal holding member 3 by the molten resin injected from the injection hole 511 is received by the protruding portion 31 and the terminal holding member 3 is thereby prevented from moving or tilting during injection molding.

(4) Since the protruding portion 31 is configured that at least a portion of the side surface 31b surrounding the tip end surface 31a is fusion-bonded over the circumference to the molded resin portion 4, it is possible to enhance waterproof properties of the molded connector 10.

[Second Embodiment]

Next, the second embodiment of the invention will be described in reference to FIGS. 7A to 8B. A molded connector and a wire harness in the second embodiment is provided with a terminal holding member 3A having a different configuration from the terminal holding member 3 in the first embodiment, and the remaining configuration is the same as the first embodiment. In the following description, the configuration of the terminal holding member 3A, which is a difference, will be mainly described, and the same constituent elements as those described in the first embodiment are denoted by the same reference numerals and the overlapping explanation thereof will be omitted.

Figure 7A:
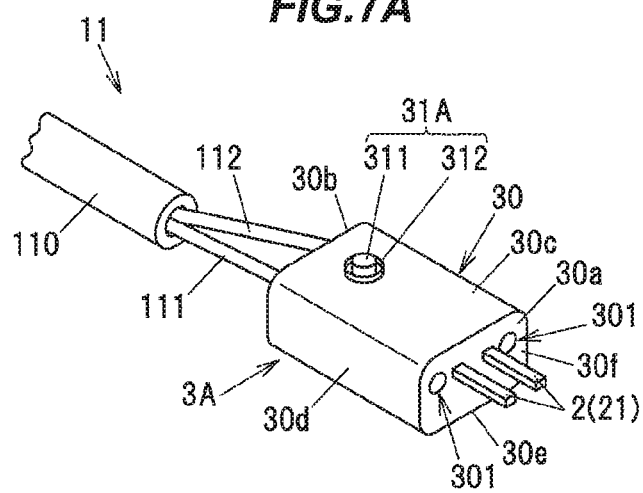
FIG. 7A is a perspective view showing a terminal holding member in a second embodiment of the invention together with the cable and the terminal fittings.
Figure 7B:
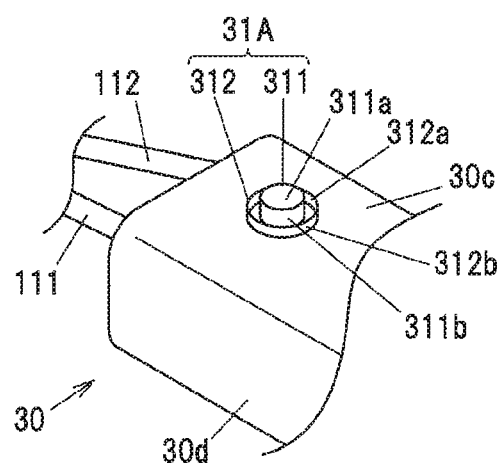
FIG. 7B is a partial enlarged view of FIG. 7A.
Figure 7C:
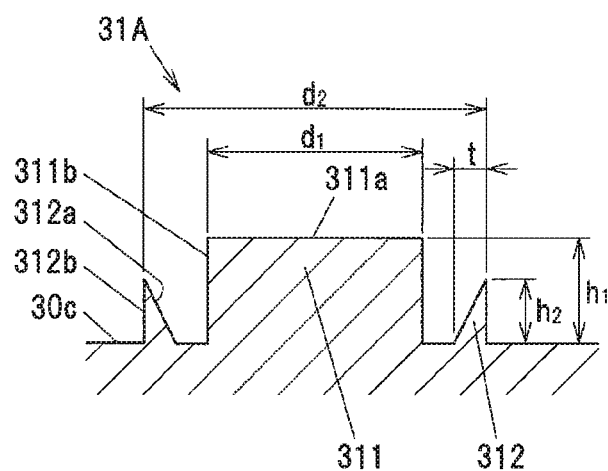
FIG. 7C is a cross sectional view showing a protruding portion of the terminal holding member.
Figure 8A:
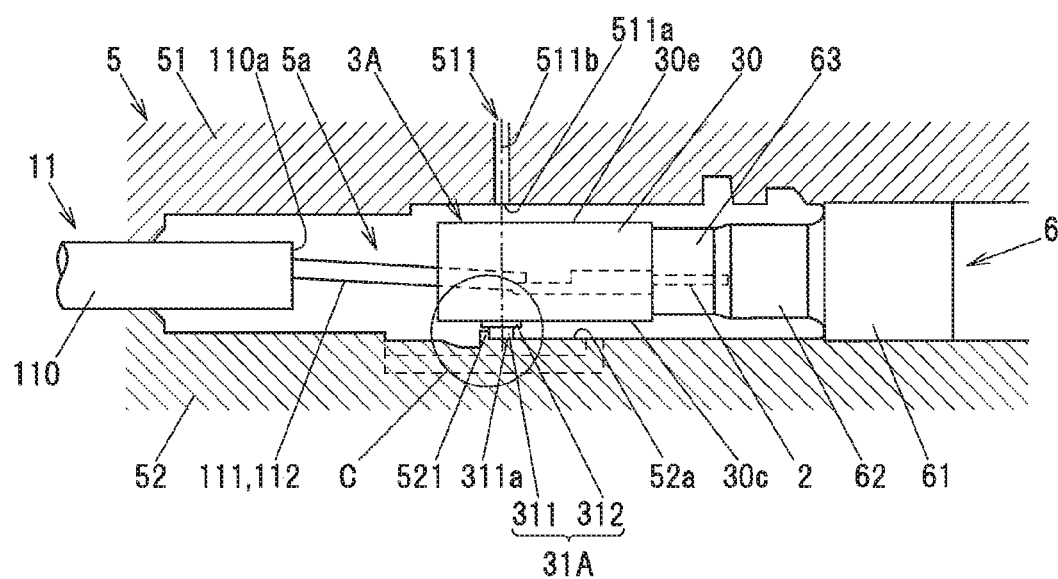
FIG. 8A is an explanatory diagram illustrating a state in which the terminal holding member, together with the terminal fittings and the end portion of the cable, is housed in the cavity of the mold.
Figure 8B:
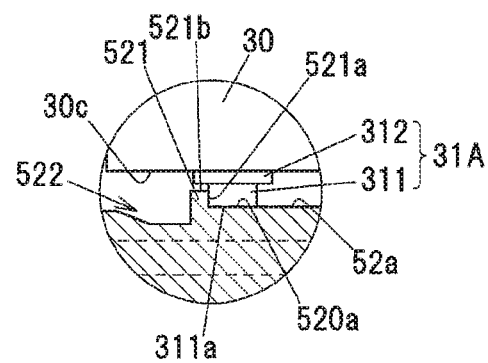
FIG. 8B is an enlarged view of a portion C in FIG. 8A.

FIG. 7A is a perspective view showing the terminal holding member 3A in the second embodiment. FIG. 7B is a partial enlarged view of FIG. 7A. FIG. 7C is a cross sectional view showing a protruding portion 31A of the terminal holding member 3A. FIG. 8A is an explanatory diagram illustrating a state in which the terminal holding member 3A, together with the terminal fittings 2 and the end portion of the cable 11, is housed in the cavity 5a of the mold 5. FIG. 8B is an enlarged view of a portion C in FIG. 8A.

In the second embodiment, the protruding portion 31A has a columnar protrusion 311 and a peripheral wall 312 surrounding the protrusion 311. The protrusion 311 is formed in, e.g., a columnar shape in the same manner as the protruding portion 31 of the terminal holding member 3 in the first embodiment, and has a tip end surface 311a which comes into contact with the contact surface 520a of the cavity-forming surface 52a of the lower mold 52 during injection molding.

The peripheral wall 312 is a circular wall provided upright on the third side surface 30c of the main body 30 of the terminal holding member 3A and has an inner peripheral surface 312a which faces a side surface 311b of the protrusion 311 at a distance. In addition, the peripheral wall 312 has a tapered shape in which thickness in a radial direction is thinner at a portion closer to the top, e.g., farther from the third side surface 30c, as shown in FIG. 7C. In more detail, an outer peripheral surface 312b of the peripheral wall 312 is perpendicular to the third side surface 30c of the main body 30, and an angle formed between the inner peripheral surface 312a of the peripheral wall 312 and the third side surface 30c is obtuse. Thus, the inner peripheral surface 312a of the peripheral wall 312 has a tapered shape in which an inner diameter increases toward the top of the peripheral wall 312, and the peripheral wall 312 has a triangular cross section.

As shown in FIG. 7C, when the diameter of the protrusion 311 is defined as $d_1$, the outer diameter of the peripheral wall 312 as $d_2$, the height of the protrusion 311 (the protrusion length from the third side surface 30c of the main body 30) as $h_1$, the height of the peripheral wall 312 as $h_2$ and the thickness at a base portion (an end portion on the third side surface 30c side) of the peripheral wall 312 as t, $d_1$ is, e.g., 2.0 mm, $d_2$ is, e.g., 3.0 mm, $h_1$ is, e.g., 1.0 mm, $h_2$ is, e.g., 0.6 mm and t is, e.g., 0.3 mm. As such, the protrusion 311 has a larger height from the third side surface 30c of the main body 30 than the peripheral wall 312, and the protrusion 311 protrudes beyond the top edge of the peripheral wall 312 when viewing the protruding portion 31A from the longitudinal direction of the terminal holding member 3A.

When the terminal holding member 3A is placed in the cavity 5a of the mold 5, the protrusion 311 of the protruding portion 31A is locked to the locking portion 521 of the lower mold 52, as shown in FIG. 8A. In more detail, the tip end surface 311a of the protrusion 311 comes into contact with the contact surface 520a of the lower mold 52, and the side surface 311b of the protrusion 311 comes into contact with, or faces with a slight gap, the contact surface 521a of the locking portion 521. Then, when pressure of the molten resin acts on the end face 110a of the sheath 110, the protrusion 311 butts against the contact surface 521a and is locked to the locking portion 521, thereby restricting movement of the terminal holding member 3A.

In addition, at least a portion of the peripheral wall 312 is melted over the circumference by heat of the molten resin and the protruding portion 31A is thus fusion-bonded to the molded resin portion 4. Therefore, even if water enters along the side surface 311b of the protrusion 311, the water is blocked by the fusion-bonding between the peripheral wall 312 and the molded resin portion 4. The waterproof properties of the molded connector are thereby enhanced.

In addition, since the peripheral wall 312 is formed so that the thickness thereof is reduced toward the top, it is easily melted by heat of the molten resin. Therefore, even when the temperature of the molten resin is not as high as it causes the protrusion 311 to melt, it is possible to melt at least a portion of the peripheral wall 312 including the top end which is thereby fusion-bonded to the molded resin portion 4.

Summary of the Embodiments

Technical ideas understood from the embodiments will be described below citing the reference numerals, etc., used for the embodiments. However, each reference numeral described below is not intended to limit the constituent elements in the claims to the members, etc., specifically described in the embodiments.

[1] A molded connector (10) comprising: terminal fittings (2) connected to a cable (11); a terminal holding member (3/3A) comprising a resin and holding the terminal fittings (2); and a molded resin portion (4) formed by injection molding using a mold (5) and holding an end portion of the cable (11) and the terminal holding member (3/3A), wherein the terminal holding member (3/3A) comprises a main body (30) holding the terminal fittings (2) and a protruding portion (31/31A) that is formed to protrude from the main body (30) and comprises a tip end surface (31a/311a) to be in contact with an inner surface of a cavity (5a) of the mold (5) during the injection molding, the protruding portion (31/31A) is locked to a locking portion (521) provided on the mold (5) to restrict the terminal holding member (3/3A) from moving during the injection molding, and at least a portion of the protruding portion (31/31A) is fusion-bonded to the molded resin portion (4).

[2] The molded connector (10) described in the [1], wherein the cable (11) comprises a plurality of electric wires (111, 112) and a sheath (110) covering all the plurality of electric wires (111, 112) together, the terminal fittings (2) are respectively connected to the plurality of electric wires (111, 112) exposed from an end face (110a) of the sheath (110), and the protruding portion (31/31A) is locked to the locking portion (521) to restrict the terminal holding member (3/3A) from moving toward the sheath (110).

[3] The molded connector (10) described in the [1] or [2], wherein the tip end surface (31a/311a) of the protruding portion (31/31A) intersects with an extension line (511b) of an injection hole (511) used to inject a molten resin into the cavity (5a).

[4] The molded connector (10) described in any of the [1] to [3], wherein the protruding portion (31) comprises a columnar protrusion with the tip end surface (31a), and a side surface (31b) of the protruding portion (31) surrounding the tip end surface (31a) is fusion-bonded to the molded resin portion (4).

[5] The molded connector (10) described in any of the [1] to [3], wherein the protruding portion (31A) comprises a columnar protrusion (311) with the tip end surface (311a) and a peripheral wall (312) surrounding the protrusion (311), and at least a portion of the peripheral wall (321) is fusion-bonded over the circumference to the molded resin portion (4).

[6] A method for manufacturing a molded connector (10) that comprises terminal fittings (2) connected to a cable (11), a terminal holding member (3/3A) comprising a resin and holding the terminal fittings (2), and a molded resin portion (4) formed by injection molding using a mold (5) and holding an end portion of the cable (11) and the terminal holding member (3/3A), wherein the terminal holding member (3/3A) comprises a main body (30) holding the terminal fittings (2) and a protruding portion (31/31A) protruding from the main body (30), the mold (5) comprises a cavity (5a) having an inner surface to be in contact with a tip end surface (31a/311a) of the protruding portion (31/31A) and a locking portion (521) for locking the protruding portion (31/31A), the protruding portion (31/31A) of the terminal holding member (3/3A) is locked to the locking portion (521) to restrict the terminal holding member (3/3A) from moving during the injection molding, and at least a portion of the protruding portion (31/31A) is melted by heat of a molten resin injected into the cavity (5a).

[7] The method for manufacturing a molded connector (10) described in the [6], wherein an outlet port (511a) for injecting a molten resin into the cavity (5a) during the injection molding is formed on the mold (5) so as to face toward a contact surface (520a) to be in contact with the tip end surface (31a/311a) of the protruding portion (31/31A).

[8] The method for manufacturing a molded connector (10) described in the [6] or [7], wherein the cable (11) comprises a plurality of electric wires (111, 112) and a sheath (110) covering all the plurality of electric wires (111, 112) together, the terminal fittings (2) are respectively connected to the plurality of electric wires (111, 112) exposed from an end face (110a) of the sheath (110), and the protruding portion (31/31A) is locked to the locking portion (521) to restrict the terminal holding member (3/3A) from moving toward the sheath (110) during the injection molding.

[9] The method for manufacturing a molded connector (10) described in any of the [6] to [8], wherein the protruding portion (31) comprises a columnar protrusion with the tip end surface (31a), and a side surface (31b) of the protruding portion surrounding the tip end surface (31a) is melted by heat of the molten resin.

[10] The method for manufacturing a molded connector (10) described in any of the [6] to [8], wherein the protruding portion (31A) comprises a columnar protrusion (311) with the tip end surface (311a) and a peripheral wall (312) surrounding the protrusion (311), and at least a portion of the peripheral wall (312) is melted over the circumference thereof by heat of the molten resin.

[11] A wire harness (1) comprising: a cable (11); terminal fittings (2) connected to the cable (11); a terminal holding member (3/3A) comprising a resin and holding the terminal fittings (2); and a molded resin portion (4) formed by injection molding using a mold (5) and holding an end portion of the cable (110) and the terminal holding member (3/3A), wherein the terminal holding member (3/3A) comprises a main body (30) holding the terminal fittings (2) and a protruding portion (31/31A) that is formed to protrude from the main body (30) and comprises a tip end surface (31a/311a) to be in contact with an inner surface of a cavity (5a) of the mold (5) during the injection molding, the protruding portion (31/31A) is locked to a locking portion (521) provided on the mold (5) to restrict the terminal holding member (3/3A) from moving during the injection molding, and at least a portion of the protruding portion (31/31A) is fusion-bonded to the molded resin portion (4).

Although the embodiments of the invention have been described, the invention according to claims is not to be limited to the embodiments described above. Further, please note that all combinations of the features described in the embodiments are not necessary to solve the problem of the invention.

REFERENCE SIGNS LIST

1: WIRE HARNESS
10: MOLDED CONNECTOR
11: CABLE
110: SHEATH
110a: END FACE
2: TERMINAL FITTING
3, 3A: TERMINAL HOLDING MEMBER
30: MAIN BODY
31, 31A: PROTRUDING PORTION
311: PROTRUSION
311a: TIP END SURFACE
311b: SIDE SURFACE
312: PERIPHERAL WALL
31a: TIP END SURFACE
31b: SIDE SURFACE
4: MOLDED RESIN PORTION
5: MOLD
511: INJECTION HOLE
511a: OPENING
521: LOCKING PORTION
5a: CAVITY
6: DIE INSERT

The invention claimed is:

1. A wire harness, comprising:
terminal fittings connected to a cable;
a terminal holding member comprising a resin and holding the terminal fittings; and
a molded resin portion formed by injection molding using a mold and holding an end portion of the cable and the terminal holding member;
wherein the terminal holding member comprises a main body holding the terminal fittings and a protruding portion that is formed to protrude from the main body and comprises a tip end surface to be in contact with an inner surface of a cavity of the mold during the injection molding, the protruding portion is locked to a locking portion provided on the mold to restrict the terminal holding member from moving during the injection molding, and at least a portion of the protruding portion is fusion-bonded to the molded resin portion.

2. The wire harness according to claim 1,
wherein the cable comprises a plurality of electric wires and a sheath covering all the plurality of electric wires together, the terminal fittings are respectively connected to the plurality of electric wires exposed from an end face of the sheath, and the protruding portion is locked to the locking portion to restrict the terminal holding member from moving toward the sheath.

3. The wire harness according to claim 2,
wherein the tip end surface of the protruding portion intersects with an extension line of an injection hole used to inject a molten resin into the cavity.

4. The wire harness according to claim 2,
wherein the protruding portion comprises a columnar protrusion with the tip end surface, and a side surface of the protruding portion surrounding the tip end surface is fusion-bonded to the molded resin portion.

5. The wire harness according to claim 2,
wherein the protruding portion comprises a columnar protrusion with the tip end surface and a peripheral wall surrounding the protrusion, and at least a portion of the peripheral wall is fusion-bonded over the circumference to the molded resin portion.

6. The wire harness according to claim 1,
wherein the tip end surface of the protruding portion intersects with an extension line of an injection hole used to inject a molten resin into the cavity.

7. The wire harness according to claim 6,
wherein the protruding portion comprises a columnar protrusion with the tip end surface, and a side surface of the protruding portion surrounding the tip end surface is fusion-bonded to the molded resin portion.

8. The wire harness according to claim 6,
wherein the protruding portion comprises a columnar protrusion with the tip end surface and a peripheral wall surrounding the protrusion, and at least a portion of the peripheral wall is fusion-bonded over the circumference to the molded resin portion.

9. The wire harness according to claim 1,
wherein the protruding portion comprises a columnar protrusion with the tip end surface, and a side surface of the protruding portion surrounding the tip end surface is fusion-bonded to the molded resin portion.

10. The wire harness according to claim 1,
wherein the protruding portion comprises a columnar protrusion with the tip end surface and a peripheral wall surrounding the protrusion, and at least a portion of the peripheral wall is fusion-bonded over the circumference to the molded resin portion.

11. A method for manufacturing a wire harness that comprises terminal fittings connected to a cable, a terminal holding member comprising a resin and holding the terminal fittings, and a molded resin portion formed by injection molding using a mold and holding a portion of the cable and the terminal holding member, wherein the terminal holding member comprises a main body holding the terminal fittings and a protruding portion protruding from the main body, the mold comprises a cavity having an inner surface to be in contact with a tip end surface of the protruding portion and a locking portion for locking the protruding portion, the protruding portion of the terminal holding member is locked to the locking portion to restrict the terminal holding member from moving during the injection molding, and at least a portion of the protruding portion is melted by heat of a molten resin injected into the cavity.

12. The method for manufacturing a wire harness according to claim 11, wherein an outlet port for injecting a molten resin into the cavity during the injection molding is formed on the mold so as to face toward a contact surface to be in contact with the tip end surface of the protruding portion.

13. The method for manufacturing a wire harness according to claim 12,
wherein the cable comprises a plurality of electric wires and a sheath covering all the plurality of electric wires together, the terminal fittings are respectively connected to the plurality of electric wires exposed from an end face of the sheath, and the protruding portion is locked to the locking portion to restrict the terminal holding member from moving toward the sheath during the injection molding.

14. The method for manufacturing a wire harness according to claim 12,
wherein the protruding portion comprises a columnar protrusion with the tip end surface, and a side surface of the protruding portion surrounding the tip end surface is melted by heat of the molten resin.

15. The method for manufacturing a wire harness according to claim 12,
wherein the protruding portion comprises a columnar protrusion with the tip end surface and a peripheral wall surrounding the protrusion, and at least a portion of the peripheral wall is melted over the circumference thereof by heat of the molten resin.

16. The method for manufacturing a wire harness according to claim 11, wherein the cable comprises a plurality of electric wires and a sheath covering all the plurality of electric wires together, the terminal fittings are respectively connected to the plurality of electric wires exposed from an end face of the sheath, and the protruding portion is locked to the locking portion to restrict the terminal holding member from moving toward the sheath during the injection molding.

17. The method for manufacturing a wire harness according to claim 16,
wherein the protruding portion comprises a columnar protrusion with the tip end surface, and a side surface of the protruding portion surrounding the tip end surface is melted by heat of the molten resin.

18. The method for manufacturing a wire harness according to claim 16,
wherein the protruding portion comprises a columnar protrusion with the tip end surface and a peripheral wall surrounding the protrusion, and at least a portion of the peripheral wall is melted over the circumference thereof by heat of the molten resin.

19. The method for manufacturing a wire harness according to claim 11, wherein the protruding portion comprises a columnar protrusion with the tip end surface, and a side surface of the protruding portion surrounding the tip end surface is melted by heat of the molten resin.

20. The method for manufacturing a wire harness according to claim 11,
wherein the protruding portion comprises a columnar protrusion with the tip end surface and a peripheral wall surrounding the protrusion, and at least a portion of the peripheral wall is melted over the circumference thereof by heat of the molten resin.

* * * * *